(12) United States Patent
Cois et al.

(10) Patent No.: US 10,444,291 B2
(45) Date of Patent: Oct. 15, 2019

(54) METHOD FOR DETERMINING A POTENTIAL OF AN ANODE AND/OR A POTENTIAL OF A CATHODE IN A BATTERY CELL

(71) Applicant: Robert Bosch GmbH, Stuttgart (DE)

(72) Inventors: Olivier Cois, Kernen (DE); Thomas Dufaux, Stuttgart (DE); Andre Boehm, Marbach am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 162 days.

(21) Appl. No.: 15/577,646

(22) PCT Filed: May 13, 2016

(86) PCT No.: PCT/EP2016/060858
§ 371 (c)(1),
(2) Date: Nov. 28, 2017

(87) PCT Pub. No.: WO2016/192961
PCT Pub. Date: Dec. 8, 2016

(65) Prior Publication Data
US 2018/0136286 A1    May 17, 2018

(30) Foreign Application Priority Data

May 29, 2015  (DE) .......................... 10 2015 209 995
Jun. 30, 2015  (DE) .......................... 10 2015 212 176

(51) Int. Cl.
*G01R 31/00*   (2006.01)
*G01R 31/367*  (2019.01)
(Continued)

(52) U.S. Cl.
CPC ......... *G01R 31/367* (2019.01); *G01R 31/389* (2019.01); *G01R 31/392* (2019.01)

(58) Field of Classification Search
USPC ................................. 324/426, 427, 430, 431
See application file for complete search history.

(56) References Cited

U.S. PATENT DOCUMENTS

2006/0022676 A1*  2/2006  Uesaka .............. G01R 31/3648
324/429
2009/0295337 A1   12/2009  Ishikawa
(Continued)

FOREIGN PATENT DOCUMENTS

DE   102011117098   9/2012
DE   102012223796   6/2014
(Continued)

OTHER PUBLICATIONS

International Search Report for Application No. PCT/EP2016/060858 dated Sep. 22, 2016 (English Translation, 3 pages).

*Primary Examiner* — Vincent Q Nguyen
(74) *Attorney, Agent, or Firm* — Michael Best & Friedrich LLP

(57) ABSTRACT

A method determines a potential of an anode and/or a potential of a cathode in a battery cell. The method measures a current flowing through the battery cell, determines a charge transfer resistance of the battery cell, ascertains a charge transfer resistance of the anode and a charge transfer resistance of the cathode, ascertains a depth of discharge, ascertains an anode residual voltage and a cathode residual voltage from the depth of discharge from an idle voltage, ascertains an anode excess potential from the charge transfer resistance of the anode and the current and ascertains a cathode excess potential from the charge transfer resistance of the cathode and the current. The method ascertains the potential of the anode from the anode residual voltage and the anode excess potential and ascertains the potential of the cathode from the cathode residual potential and the cathode excess potential.

18 Claims, 4 Drawing Sheets

(51) Int. Cl.
    *G01R 31/389*     (2019.01)
    *G01R 31/392*     (2019.01)

(56) References Cited

U.S. PATENT DOCUMENTS

| | | | |
|---|---|---|---|
| 2012/0105013 A1* | 5/2012 | Lin | H02J 7/0021 |
| | | | 320/162 |
| 2012/0105068 A1 | 5/2012 | Wang et al. | |
| 2013/0095391 A1* | 4/2013 | Baba | H01M 4/485 |
| | | | 429/331 |
| 2013/0335030 A1 | 12/2013 | Joe et al. | |

FOREIGN PATENT DOCUMENTS

| | | |
|---|---|---|
| DE | 112012006792 | 4/2015 |
| EP | 2579381 | 4/2013 |
| EP | 2762908 | 8/2014 |
| WO | 2011001266 | 1/2011 |

* cited by examiner

METHOD FOR DETERMINING A POTENTIAL OF AN ANODE AND/OR A POTENTIAL OF A CATHODE IN A BATTERY CELL

BACKGROUND OF THE INVENTION

The invention relates to a method for determining a potential of an anode and/or a potential of a cathode in a battery cell which has a negative terminal and a positive terminal.

Electrical energy can be stored by means of batteries. Batteries convert chemical reaction energy into electrical energy. In this case, a distinction is made between primary batteries and secondary batteries. Primary batteries are functional only once, whereas secondary batteries, which are also referred to as rechargeable batteries, are rechargeable. In this case, a battery comprises one or more battery cells.

So-called lithium ion battery cells, in particular, are used in a rechargeable battery. These are distinguished, inter alia, by high energy densities, thermal stability and an extremely low self-discharge. Lithium ion battery cells are used, inter alia, in motor vehicles, in particular in electric vehicles (EV), hybrid vehicles (hybrid electric vehicle, HEV) and plug-in hybrid vehicles (plug-in hybrid electric vehicle, PHEV).

Lithium ion battery cells have a positive electrode, which is also referred to as a cathode, and a negative electrode, which is also referred to as an anode. The cathode and the anode each comprise a current collector, to which an active material is applied. The active material for the cathode is a metal oxide, for example. The active material for the anode is silicon, for example. However, graphite is also widespread as an active material for anodes.

Lithium atoms are embedded in the active material of the anode. During a discharging operation of the battery cell, electrons flow in an outer circuit from the anode to the cathode. During a discharging operation, lithium ions flow from the anode to the cathode inside the battery cell. In this case, the lithium ions are reversibly transferred from the active material of the anode, which is also referred to as de-intercalation. During a charging operation of the battery cell, the lithium ions migrate from the cathode to the anode. In this case, the lithium ions are reversibly embedded in the active material of the anode again, which is also referred to as intercalation.

The electrodes of the battery cell have a film-like design and are wound, with the interposition of separator which separates the anode from the cathode, to form an electrode roll. Such an electrode roll is also referred to as a jelly roll. The electrodes can also be layered on top of one another to form an electrode stack.

The two electrodes of the electrode roll or of the electrode stack are electrically connected, by means of collectors, to poles of the battery cell which are also referred to as terminals. A battery cell generally comprises one or more electrode rolls or electrode stacks. The electrodes and the separator are penetrated by a generally liquid electrolyte. The electrolyte is conductive for the lithium ions and makes it possible to transport the lithium ions between the electrodes.

A battery cell of the generic type which comprises an anode arranged inside a housing and a cathode and two terminals is known from DE 10 2012 223 796 A1, for example.

A method for assessing a functional state of a battery cell is disclosed in DE 10 2011 117 098 A1. In this case, a cell voltage and a state of charge of the battery cell are monitored and functional state parameters of the battery cell are determined.

EP 2 762 908 A1 discloses a method for determining the power of a battery cell. In this case, the cell temperature, current and voltage, inter alia, are measured while the battery cell is being charged or discharged. An internal resistance of the battery cell is then determined from the measured data.

SUMMARY OF THE INVENTION

A method for determining a potential P1 of an anode and/or a potential P2 of a cathode in a battery cell is proposed. In this case, the battery cell has a negative terminal and a positive terminal, and a cell voltage Ucell is applied between the negative terminal and the positive terminal of the battery cell.

The potential P1 of the anode corresponds to the difference between the electrochemical potential $\Phi 1s$ at the surface of the anode and the electrochemical potential $\Phi 1e$ of an electrolyte surrounding the anode:

$$P1 = \Phi 1s - \Phi 1e$$

The potential P2 of the cathode corresponds to the difference between the electrochemical potential $\Phi 2s$ at the surface of the cathode and the electrochemical potential $\Phi 2e$ of an electrolyte surrounding the cathode:

$$P2 = \Phi 2s - \Phi 2e$$

The cell voltage Ucell corresponds to the difference between the electrochemical potential $\Phi 1s$ at the surface of the anode and the electrochemical potential $\Phi 2s$ at the surface of the cathode:

$$U\text{cell} = \Phi 1s - \Phi 2s$$

According to the invention, the following steps are provided in this case:

measuring a current I flowing through the battery cell, determining a charge transfer resistance Rct of the battery cell, determining a charge transfer resistance Rct1 of the anode and/or a charge transfer resistance Rct2 of the cathode from the charge transfer resistance Rct, determining an open-circuit voltage UR of the battery cell, determining a depth of discharge DOD of the battery cell from the open-circuit voltage UR, determining an anode residual voltage U1 and/or a cathode residual voltage U2 from the depth of discharge DOD of the battery cell, determining an anode excess potential N1 from the charge transfer resistance Rct1 of the anode and the current I and/or a cathode excess potential N2 from the charge transfer resistance Rct2 of the cathode and the current I, determining the potential P1 of the anode from the anode residual voltage U1 and the anode excess potential N1 and/or the potential P2 of the cathode from the cathode residual voltage U2 and the cathode excess potential N2.

In this case, the charge transfer resistance Rct of the battery cell is advantageously determined by a battery management system. Corresponding methods for this purpose are known from the prior art.

With knowledge of the charge transfer resistance Rct of the battery cell, the charge transfer resistance Rct1 of the anode and the charge transfer resistance Rct2 of the cathode can be determined. In this case:

$$Rct = Rct1 + Rct2$$

The charge transfer resistance Rct1 of the anode and the charge transfer resistance Rct2 of the cathode have a constant ratio with respect to one another which can be described, for example, by means of a ratio value k between the charge transfer resistance Rct2 of the cathode and the charge transfer resistance Rct. The constant ratio value k is advantageously determined as follows in preparation for the method:

$$k = Rct2/Rct$$

The charge transfer resistance Rct1 of the anode can be determined from the ratio value k and the charge transfer resistance Rct. The charge transfer resistance Rct2 of the cathode can likewise be determined from the ratio value k and the charge transfer resistance Rct. The following applies:

$$Rct1 = (1-k)*Rct$$

$$Rct2 = k*Rct$$

In the case of an idling battery, that is to say when no current I is flowing, the open-circuit voltage UR can be directly measured between the terminals of the battery cell. However, if the battery cell is in operation and a current I is flowing, it is not possible to directly measure the open-circuit voltage UR.

If a battery cell is in operation, a non-reactive resistance R0 of the battery cell is determined and the cell voltage Ucell applied between the terminals of the battery cell is measured in order to determine the open-circuit voltage UR. The open-circuit voltage UR is then determined from the cell voltage Ucell, the non-reactive resistance R0, the charge transfer resistance Rct and the current I according to the following equation:

$$UR = Ucell - (R0*I + Rct*I)$$

In this case, the non-reactive resistance R0 of the battery cell is advantageously determined by a battery management system. Corresponding methods for this purpose are known from the prior art.

The depth of discharge DOD of the battery cell is dependent on the open-circuit voltage UR. The depth of discharge DOD of the battery cell is gathered from a discharge table FE which is created in preparation for the method and indicates the depth of discharge DOD of the battery cell on the basis of the open-circuit voltage. The following is obtained:

$$DOD = FE(UR)$$

$$DOD = FE(Ucell - (R0*I + Rct*I))$$

The anode residual voltage U1 is dependent on the depth of discharge DOD of the battery cell. The anode residual voltage U1 is gathered from an anode table FA which is created in preparation for the method and indicates the anode residual voltage U1 on the basis of the depth of discharge DOD. The following is obtained:

$$U1 = FA(DOD)$$

The cathode residual voltage U2 is dependent on the depth of discharge DOD of the battery cell. The cathode residual voltage U2 is gathered from a cathode table FK which is created in preparation for the method and indicates the cathode residual voltage U2 on the basis of the depth of discharge DOD. The following is obtained:

$$U2 = FK(DOD)$$

The anode excess potential N1 is determined from the charge transfer resistance Rct1 of the anode and from the current I according to the following equation:

$$N1 = -Rct1*I$$

The cathode excess potential N2 is determined from the charge transfer resistance Rct2 of the cathode and from the current I according to the following equation:

$$N2 = Rct2*I$$

The potential P1 of the anode is determined from the anode residual voltage U1 and the anode excess potential N1 according to the following equation:

$$P1 = N1 + U1$$

$$P1 = (k-1)*Rct*I + FA(FE(Ucell - (R0*I + Rct*I)))$$

The potential P2 of the cathode is determined from the cathode residual voltage U2 and the cathode excess potential N2 according to the following equation:

$$P2 = N2 + U2$$

$$P2 = k*Rct*I + FK(FE(Ucell - (R0*I + Rct*I)))$$

A computer program for carrying out the method according to the invention is also proposed, the computer program being executed on a programmable computer device.

A battery management system which is set up to carry out the method according to the invention is also proposed.

The method according to the invention is advantageously used in a battery cell in an electric vehicle (EV), in a hybrid vehicle (HEV), in a plug-in hybrid vehicle (PHEV) or in a consumer electronics product. Consumer electronics products can be understood as meaning, in particular, mobile telephones, tablet PCs or notebooks.

Determining the potential of the anode and the potential of the cathode of the battery cell makes it possible to infer the state of the battery cell, in particular aging of the battery cell. Determining the potential of the anode and the potential of the cathode of the battery cell online, in particular by measuring all parameters required for this purpose, is relatively complex and complicated. For this purpose, the method according to the invention uses a simplified model of the battery cell, as a result of which the potential of the anode and the potential of the cathode can be determined in a comparatively simple manner and, in particular, using comparatively simple means.

BRIEF DESCRIPTION OF THE DRAWINGS

Embodiments of the invention are explained in more detail using the drawings and the following description.

In the drawings.

Figure 1:
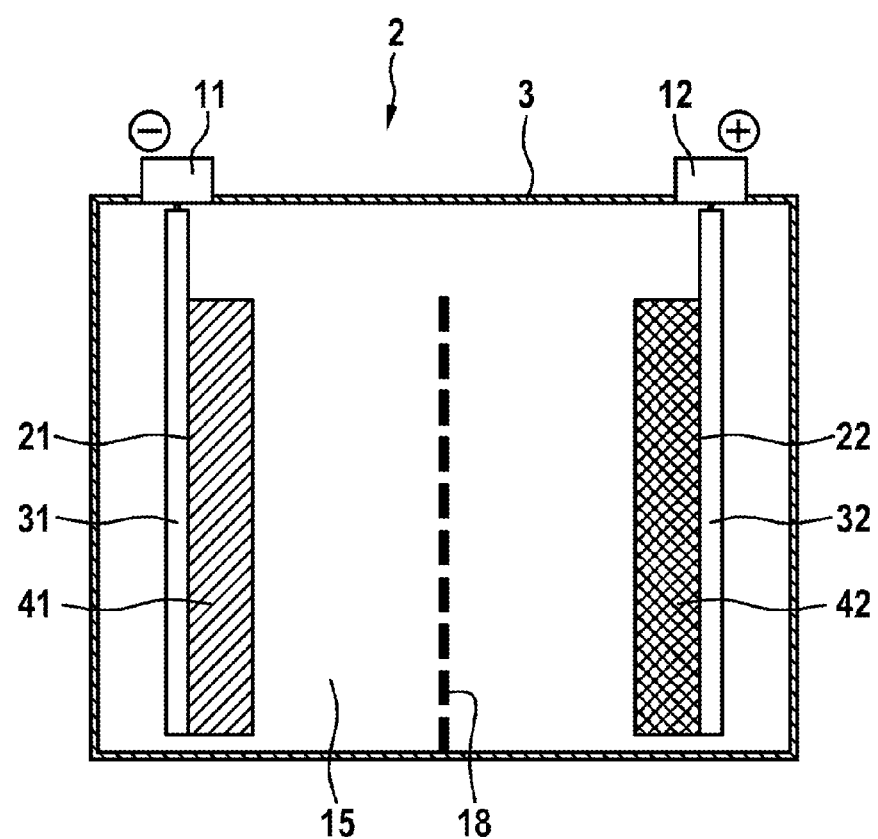
FIG. 1 shows a schematic illustration of a battery cell.

DETAILED DESCRIPTION battery cell 2 is schematically illustrated in FIG. 1. The battery cell 2 comprises a cell housing 3 which is prismatic, cuboidal in the present case. The cell housing 3 is electrically conductive in the present case and is manufactured from aluminum, for example. However, the cell housing 3 may also be manufactured from an electrically insulating material, for example plastic.

The battery cell 2 comprises a negative terminal 11 and a positive terminal 12. A voltage provided by the battery cell 2 can be tapped off via the terminals 11, 12. Furthermore, the battery cell 2 can also be charged via the terminals 11, 12. The terminals 11, 12 are arranged at a distance from one another on a covering surface of the prismatic cell housing 3.

Arranged inside the cell housing 3 of the battery cell 2 is an electrode roll which has two electrodes, namely an anode 21 and a cathode 22. The anode 21 and the cathode 22 each have a film-like design and are wound, with the interposition of a separator 18, to form the electrode roll. It is also conceivable for a plurality of electrode rolls to be provided in the cell housing 3. Instead of the electrode roll, it is also possible to provide an electrode stack, for example.

The anode 21 comprises an anodic active material 41 which has a film-like design. The anodic active material 41 has silicon or a silicon-containing alloy as the base material. The anode 21 also comprises a current collector 31 which likewise has a film-like design. The anodic active material 41 and the current collector 31 are placed against one another in a two-dimensional manner and are connected to one another.

The current collector 31 of the anode 21 is electrically conductive and is manufactured from a metal, for example copper. The current collector 31 of the anode 21 is electrically connected to the negative terminal 11 of the battery cell 2 by means of a collector.

The cathode 22 comprises a cathodic active material 42 which has a film-like design. The cathodic active material 42 has a metal oxide, for example lithium-cobalt oxide ($LiCoO_2$), as the base material. The cathode 22 also comprises a current collector 32 which likewise has a film-like design. The cathodic active material 42 and the current collector 32 are placed against one another in a two-dimensional manner and are connected to one another.

The current collector 32 of the cathode 22 is electrically conductive and is manufactured from a metal, for example aluminum. The current collector 32 of the cathode 22 is electrically connected to the positive terminal 12 of the battery cell 2 by means of a collector.

The anode 21 and the cathode 22 are separated from one another by means of the separator 18. The separator 18 likewise has a film-like design. The separator 18 is electrically insulating, but ionically conductive, that is to say permeable to lithium ions.

The cell housing 3 of the battery cell 2 is filled with a liquid electrolyte 15 or with a polymer electrolyte. In this case, the electrolyte 15 penetrates the anode 21, the cathode 22 and the separator 18. The electrolyte 15 is also ionically conductive.

Figure 2:
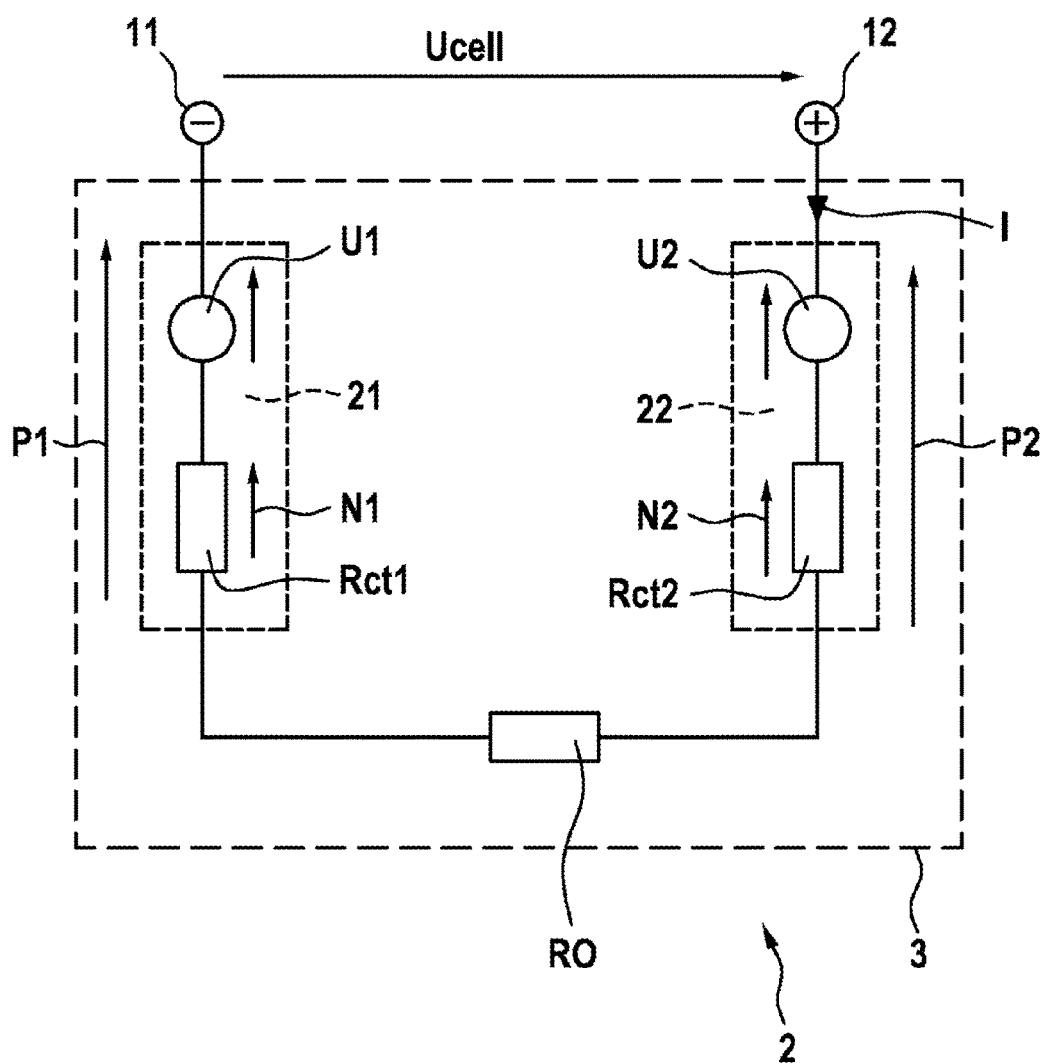
FIG. 2 shows a simplified electrical equivalent circuit diagram of the battery cell from FIG. 1.

FIG. 2 illustrates a simplified electrical equivalent circuit diagram of the battery cell 2 from FIG. 1. In this case, the terminals 11, 12 project from the cell housing 3 and are accessible from the outside, in particular for measurements. A load (not illustrated here) in the form of a non-reactive resistance is connected to the terminals 11, 12.

A cell voltage Ucell which can be directly measured from the outside is applied between said terminals 11, 12. In the present case, a current I flows from the positive terminal 12, through the battery cell 2, to the negative terminal 11, as a result of which the battery cell 2 is charged. The current I can also be directly measured from the outside.

The anode 21 is replicated by a series circuit comprising an anode voltage source and a charge transfer resistance Rct1. The anode voltage source provides an anode residual voltage U1 in this case.

The cathode 22 is replicated by a series circuit comprising a cathode voltage source and a charge transfer resistance Rct2. The cathode voltage source provides a cathode residual voltage U2 in this case.

A non-reactive resistance R0 is also provided. In this case, the non-reactive resistance R0 comprises all parasitic partial resistances of the battery cell 2, in particular the resistances of the current collectors 31, 32, a resistance of a fuse (not illustrated), a resistance of the ion transport through the separator 18, resistances of the collectors and the terminals 11, 12 and resistances of the active materials 41, 42.

In the simplified electrical equivalent circuit diagram of the battery cell 2, the anode 21, the cathode 22 and the non-reactive resistance R0 are connected in series between the negative terminal 11 and the positive terminal 12. The current I therefore flows through the anode 21, the cathode 22 and the non-reactive resistance R0.

The current I therefore also flows through the charge transfer resistance Rct1 of the anode 21. In this case, a voltage, which is referred to as the anode excess potential N1, is dropped across the charge transfer resistance Rct1 of the anode 21. A voltage which results from the sum of the anode residual voltage U1 and the anode excess potential N1 is therefore applied to the anode 21. Said sum of the anode residual voltage U1 and the anode excess potential N1 is referred to as the potential P1 of the anode 21.

The current I therefore also flows through the charge transfer resistance Rct2 of the cathode 22. In this case, a voltage, which is referred to as the cathode excess potential N2, is dropped across the charge transfer resistance Rct2 of the cathode 22. A voltage which results from the sum of the cathode residual voltage U2 and the cathode excess potential N2 is therefore applied to the cathode 22. Said sum of the cathode residual voltage U2 and the cathode excess potential N2 is referred to as the potential P2 of the cathode 22.

Figure 3:
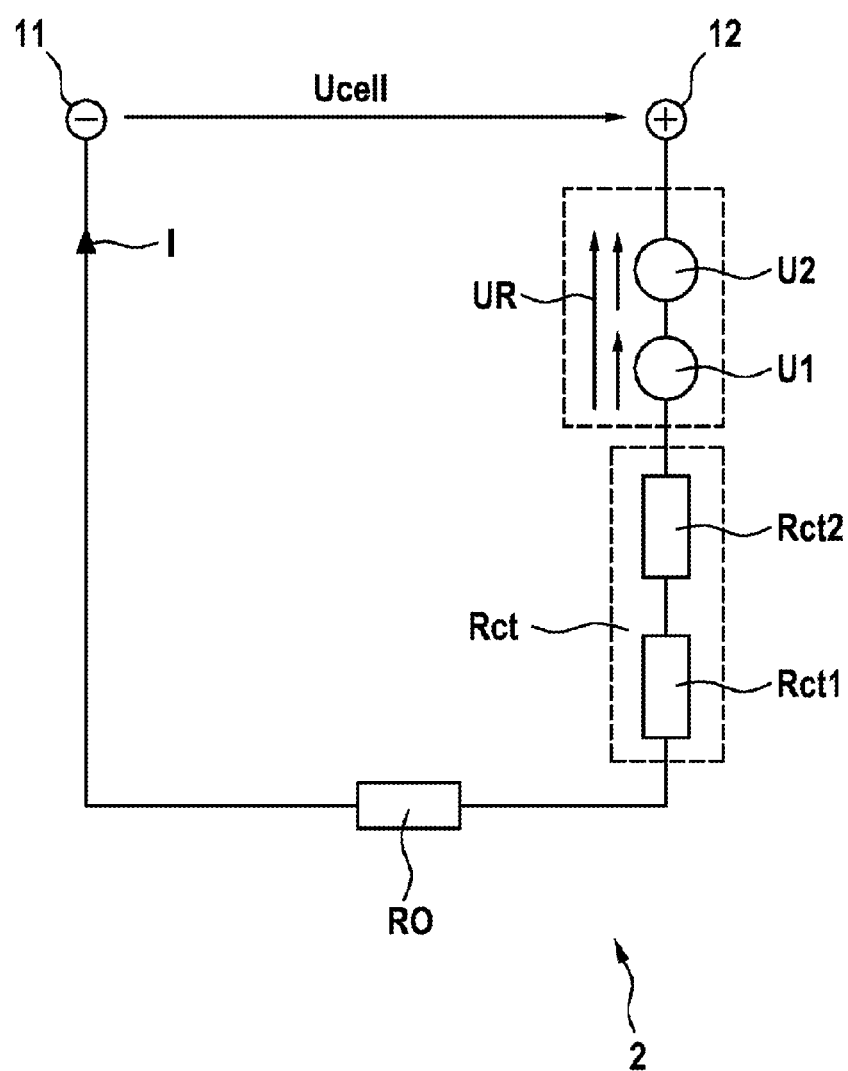
FIG. 3 shows an illustration of the electrical equivalent circuit diagram from FIG. 2, which is equivalent to the illustration in FIG. 2.

FIG. 3 shows an illustration of the electrical equivalent circuit diagram shown in FIG. 2, which is equivalent to the illustration in FIG. 2. In this case, the anode voltage source which provides the anode residual voltage U1, the cathode voltage source which provides the cathode residual voltage U2, the charge transfer resistance Rct1 of the anode 21, the charge transfer resistance Rct2 of the cathode 22 and the non-reactive resistance R0 are connected in series in a modified sequence between the negative terminal 11 and the positive terminal 12.

The current I therefore still flows through the anode voltage source, the cathode voltage source, the charge transfer resistance Rct1 of the anode 21, the charge transfer resistance Rct2 of the cathode 22 and the non-reactive resistance R0. The cell voltage Ucell is still applied between the terminals 11, 12 of the battery cell 2.

The charge transfer resistance Rct1 of the anode 21 and the charge transfer resistance Rct2 of the cathode 22 together form a charge transfer resistance Rct. The value of the charge transfer resistance Rct results as the sum of the values of the charge transfer resistance Rct1 of the anode 21 and the charge transfer resistance Rct2 of the cathode 22.

The anode voltage source which provides the anode residual voltage U1 and the cathode voltage source which provides the cathode residual voltage U2 together form a voltage source which provides an open-circuit voltage UR of the battery cell 2.

Figure 4:
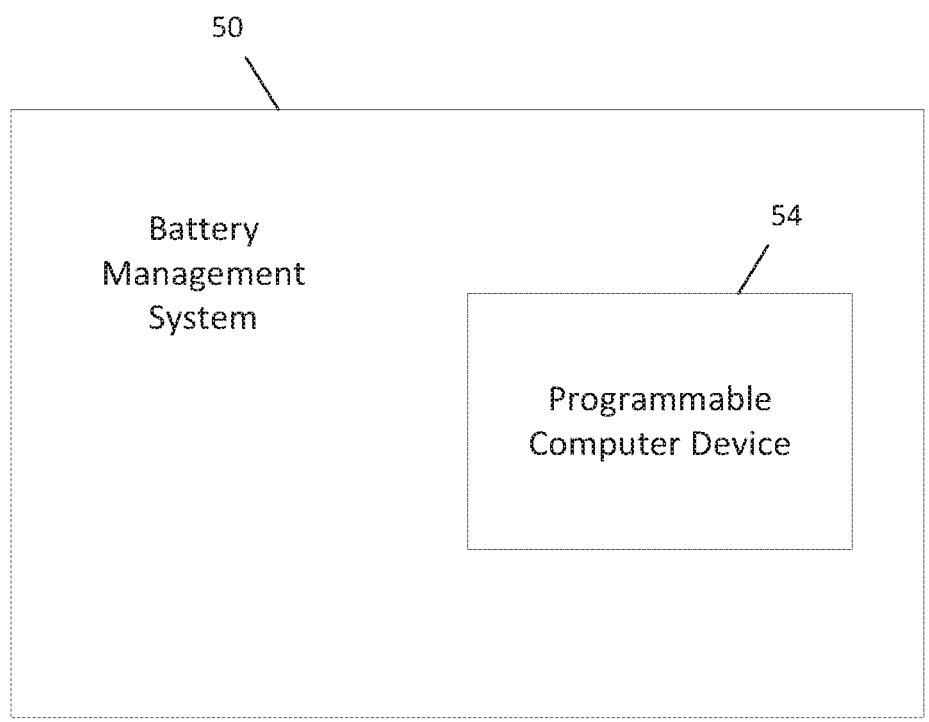
FIG. 4 shows a block diagram of a battery management system having a programmable computer device.

FIG. 4 shows a battery management system 50 to carry out the method and a programmable computer device 54 to execute a computer program for carrying out the method.

The invention is not restricted to the exemplary embodiments described here and the aspects highlighted therein. Rather, a multiplicity of modifications which are within the scope of action of a person skilled in the art are possible within the scope indicated by the claims.

The invention claimed is:

1. A method for determining a potential (P1) of an anode (21), a potential (P2) of a cathode (22), or both in a battery cell (2) which has a negative terminal (11) and a positive terminal (12), the method comprising:
    measuring a current (I) flowing through the battery cell (2),
    determining a charge transfer resistance (Rct) of the battery cell (2),
    determining a charge transfer resistance (Rct1) of the anode (21) from the charge transfer resistance (Rct), or a charge transfer resistance (Rct2) of the cathode (22) from the charge transfer resistance (Rct),
    determining an open-circuit voltage (UR) of the battery cell (2),
    determining a depth of discharge (DOD) of the battery cell (2) from the open-circuit voltage (UR),
    determining an anode residual voltage (U1) from the depth of discharge (DOD) of the battery cell (2), or a cathode residual voltage (U2) from the depth of discharge (DOD) of the battery cell (2),
    determining an anode excess potential (N1) from the charge transfer resistance (Rct1) of the anode (21) and the current (I), or a cathode excess potential (N2) from the charge transfer resistance (Rct2) of the cathode (22) and the current (I), and
    determining the potential (P1) of the anode (21) from the anode residual voltage (U1) and the anode excess potential (N1), or the potential (P2) of the cathode (22) from the cathode residual voltage (U2) and the cathode excess potential (N2).

2. The method as claimed in claim 1, characterized in that the charge transfer resistance (Rct) is determined by a battery management system.

3. The method as claimed in claim 1, wherein
    a ratio value (k) between the charge transfer resistance (Rct2) of the cathode (22) and the charge transfer resistance (Rct) is determined in preparation for the method, and in that
    the charge transfer resistance (Rct1) of the anode (21) is determined from the ratio value (k) and the charge transfer resistance (Rct), or in that the charge transfer resistance (Rct2) of the cathode (22) is determined from the ratio value (k) and the charge transfer resistance (Rct).

4. The method as claimed in claim 1, wherein
    a non-reactive resistance (R0) of the battery cell (2) is determined,
    in that a cell voltage (Ucell) applied between the terminals (11, 12) is measured, and in that
    the open-circuit voltage (UR) is determined from the cell voltage (Ucell), the non-reactive resistance (R0), the charge transfer resistance (Rct) and the current (I).

5. The method as claimed in claim 4, wherein the non-reactive resistance (R0) is determined by a battery management system.

6. The method as claimed in claim 1, wherein
    the depth of discharge (DOD) of the battery cell (2) is gathered from a discharge table (FE) which is created in preparation for the method and indicates the depth of discharge (DOD) of the battery cell (2) on the basis of the open-circuit voltage (UR).

7. The method as claimed in claim 1, wherein
    the anode residual voltage (U1) is gathered from an anode table (FA) which is created in preparation for the method and indicates the anode residual voltage (U1) on the basis of the depth of discharge (DOD), or in that
    the cathode residual voltage (U2) is gathered from a cathode table (FK) which is created in preparation for the method and indicates the cathode residual voltage (U2) on the basis of the depth of discharge (DOD).

8. A computer program for carrying out the method as claimed in claim 1, the computer program being executed on a programmable computer device.

9. A battery management system which is set up to carry out the method as claimed in claim 1.

10. The use of the method as claimed in claim 1 in a battery cell (2) in an electric vehicle (EV), in a hybrid vehicle (HEV), in a plug-in hybrid vehicle (PHEV) or in a consumer electronics product.

11. The method as claimed in claim 1, wherein
    the depth of discharge (DOD) of the battery cell (2) is gathered from a discharge table (FE) which is created in preparation for the method and indicates the depth of discharge (DOD) of the battery cell (2) on the basis of the open-circuit voltage (UR).

12. A method for determining a potential (P1) of an anode (21) and a potential (P2) of a cathode (22) in a battery cell (2) which has a negative terminal (11) and a positive terminal (12), the method comprising:
    measuring a current (I) flowing through the battery cell (2),
    determining a charge transfer resistance (Rct) of the battery cell (2),
    determining a charge transfer resistance (Rct1) of the anode (21) from the charge transfer resistance (Rct),
    determining a charge transfer resistance (Rct2) of the cathode (22) from the charge transfer resistance (Rct),
    determining an open-circuit voltage (UR) of the battery cell (2),
    determining a depth of discharge (DOD) of the battery cell (2) from the open-circuit voltage (UR),
    determining an anode residual voltage (U1) and a cathode residual voltage (U2) from the depth of discharge (DOD) of the battery cell (2),
    determining an anode excess potential (N1) from the charge transfer resistance (Rct1) of the anode (21) and the current (I),
    determining a cathode excess potential (N2) from the charge transfer resistance (Rct2) of the cathode (22) and the current (I),
    determining the potential (P1) of the anode (21) from the anode residual voltage (U1) and the anode excess potential (N1), and
    determining the potential (P2) of the cathode (22) from the cathode residual voltage (U2) and the cathode excess potential (N2).

13. The method as claimed in claim 12, characterized in that the charge transfer resistance (Rct) is determined by a battery management system.

14. The method as claimed in claim 12, wherein
a ratio value (k) between the charge transfer resistance (Rct2) of the cathode (22) and the charge transfer resistance (Rct) is determined in preparation for the method, and in that
the charge transfer resistance (Rct1) of the anode (21) is determined from the ratio value (k) and the charge transfer resistance (Rct), and in that the charge transfer resistance (Rct2) of the cathode (22) is determined from the ratio value (k) and the charge transfer resistance (Rct).

15. The method as claimed in claim 12, wherein
a non-reactive resistance (R0) of the battery cell (2) is determined,
in that a cell voltage (Ucell) applied between the terminals (11, 12) is measured, and in that
the open-circuit voltage (UR) is determined from the cell voltage (Ucell), the non-reactive resistance (R0), the charge transfer resistance (Rct), and the current (I).

16. The method as claimed in claim 15, wherein the non-reactive resistance (R0) is determined by a battery management system.

17. The method as claimed in claim 12, wherein
the anode residual voltage (U1) is gathered from an anode table (FA) which is created in preparation for the method and indicates the anode residual voltage (U1) on the basis of the depth of discharge (DOD), and
the cathode residual voltage (U2) is gathered from a cathode table (FK) which is created in preparation for the method and indicates the cathode residual voltage (U2) on the basis of the depth of discharge (DOD).

18. The use of the method as claimed in claim 12 in a battery cell (2) in an electric vehicle (EV), in a hybrid vehicle (HEV), or in a plug-in hybrid vehicle (PHEV).

* * * * *